(12) United States Patent  
Matsumoto (10) Patent No.: US 10,817,008 B2  
(45) Date of Patent: Oct. 27, 2020

(54) SEMICONDUCTOR DEVICE (71) Applicant: LAPIS Semiconductor Co., Ltd., Yokohama (JP)

(72) Inventor: Takuya Matsumoto, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 16/825,603

(22) Filed: Mar. 20, 2020

(65) Prior Publication Data

US 2020/0310483 A1 Oct. 1, 2020

(30) Foreign Application Priority Data

Mar. 28, 2019 (JP) ................ 2019-063833

(51) Int. Cl.
| | |
|---|---|
| *G11C 5/14* | (2006.01) |
| *G11C 29/02* | (2006.01) |
| *G05F 3/26* | (2006.01) |
| *H03K 3/356* | (2006.01) |

(52) U.S. Cl.  
CPC ....... *G05F 3/262* (2013.01); *H03K 3/356113* (2013.01)

(58) Field of Classification Search  
CPC .................. G05F 3/262; H03K 3/356113  
See application file for complete search history.

(56) References Cited

U.S. PATENT DOCUMENTS

| | | | |
|---|---|---|---|
| 8,023,356 B2* | 9/2011 | Oh .......... | G11C 5/147 365/189.02 |
| 10,600,494 B2* | 3/2020 | Jimenez-Olivares | ........ G11C 5/147 |
| 2016/0109515 A1* | 4/2016 | Sharda ............. | G01R 31/31705 714/729 |

FOREIGN PATENT DOCUMENTS

JP 2002-091581 A 3/2002

* cited by examiner

*Primary Examiner* — Kenneth B Wells  
(74) *Attorney, Agent, or Firm* — Rabin & Berdo, P.C.

(57) ABSTRACT

A semiconductor device includes a circuit-to-be-adjusted in which an output characteristic thereof can be adjusted by a fuse that is controlled based on a fuse signal. The semiconductor device includes a control circuit using, as a power source, an internal power source that has a converted voltage obtained by converting a voltage of an external power source, the control circuit being configured to generate control signals A, B based on an inputted test signal, the control signals being able to adjust the circuit-to-be-adjusted in place of the fuse signal. The semiconductor device includes a selector circuit that selects the fuse signal before the internal power source reaches a stable state after the external power source is turned on, and selects the control signal CS after the internal power source has reached a stable state.

6 Claims, 5 Drawing Sheets

SEMICONDUCTOR DEVICE

BACKGROUND OF THE INVENTION

Technical Field

The present invention relates to a semiconductor device, or in particular, a semiconductor device with a trimming function.

Background Arts

The trimming function means externally changing a certain parameter of an element provided for a circuit in a semiconductor device to match the characteristics of the circuit with intended characteristics. For example, a semiconductor device including an analog circuit is provided with a voltage divider that can adjust the characteristics of the analog circuit and that can change its value using a fuse, so that the analog circuit can be fine-tuned to control variations in the manufacturing process. In this case, changing the division ratio of the voltage divider is referred to as the trimming function using a fuse. In some cases, a resistance of the voltage divider is adjusted by laser repair using a laser-type repairing apparatus.

As a technology that relates to the trimming function, Japanese Patent Application Laid-open Publication No. 2002-91581 (Patent Document 1) discloses a reference voltage generating circuit and a reference voltage circuit that receives the reference voltage from the reference voltage generating circuit, that amplifies the reference voltage in a regulator circuit, and divides the amplified output to generate the first reference voltage and the second reference voltage. In this reference voltage circuit, the regulator circuit includes an arithmetic amplifier, a first voltage divider that outputs the amplified output as the first reference voltage, that divides the amplified output using a series circuit of a resistor R1 and a resistor R2, and that outputs the divided voltage as the second reference voltage. The regulator circuit includes a first trimming circuit that is connected to the first voltage divider in parallel and that divides the first reference voltage and negatively feeds the divided voltage back to the arithmetic amplifier after fine-tuning a value to be closer to the reference voltage of the reference voltage generating circuit.

The trimming function described above is used in various circuits, but a case in which the trimming function is used to adjust the output voltage of a power source circuit as in Patent Document 1 will be explained as one example of the application area. In some cases, an internal voltage, which is obtained by lowering down the external voltage, is used for a voltage that is supplied to the logic circuits in the semiconductor device such that the current consumption of the internal logic circuits is minimized More specifically, such a power source circuit is equipped with a regulator circuit that generates a band-gap reference voltage (will be referred to as VBG below) from the external voltage and that generates the required internal voltage based on the VBG.

In some semiconductor devices configured to supply a certain internal voltage to the logic circuit using such a regulator circuit, variations in the manufacturing process make it difficult to have a constant internal voltage, and thus, by having a voltage divider in the regulator circuit and making an adjustment using the voltage divider, a constant internal voltage that is not affected by variations in the manufacturing process is achieved.

Figure 4:
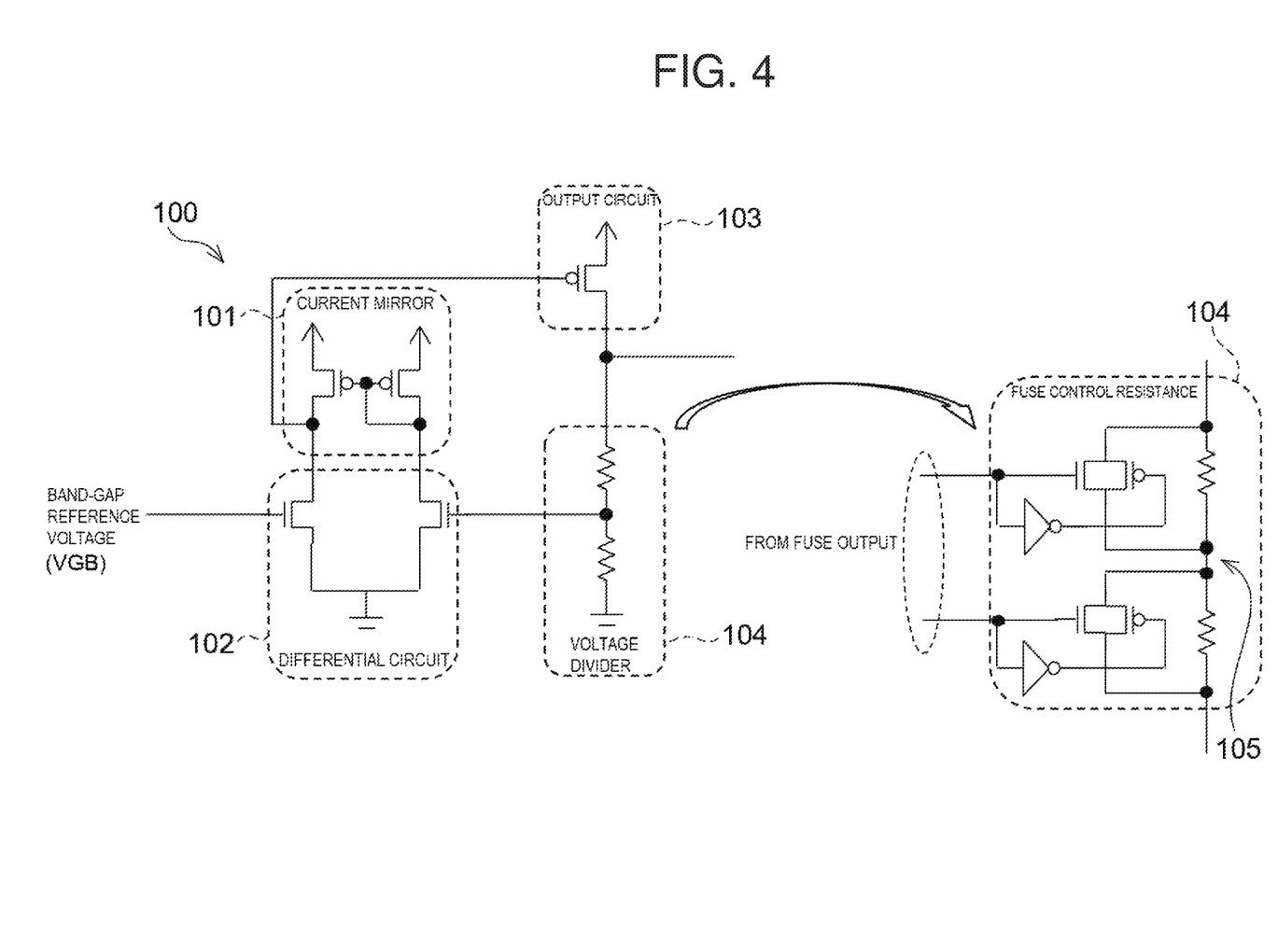
FIG. 4 is a circuit diagram illustrating the configuration of a semiconductor device of Comparison Example 1.

FIG. 4 illustrates the configuration of a regulator circuit 100 of a comparison example. As shown in FIG. 4, the regulator circuit 100 includes a current mirror 101, a differential circuit 102, an output circuit 103, and a voltage divider 104. The voltage divider 104 has a fuse control resistance ("fuse control resistance" in FIG. 4 will be referred to as a control resistance below) that changes the resistance value thereof based on a fuse output ("fuse output" in FIG. 4). Below, the fuse may also be described as "FUSE."

SUMMARY OF THE INVENTION

The circuit configuration of the regulator circuit 100 requires a fuse to be cut off by laser repair using a repairing apparatus to perform a trimming evaluation of the fuse, and if a repairing apparatus is not readily available, it would take a long time to finish the evaluation. Also, once a fuse is cut off, it is not possible to restore the circuit, and thus, if the evaluation needs to be performed many times while making changes to the trimming table (a table that shows combination of element values of the elements to be trimmed), a large number of semiconductor devices (semiconductor chips) would be needed. This would not be a problem when there are extra semiconductor chips available, but if the evaluation needs to be performed many times on different trimming tables, a large number of semiconductor chips would be required.

Figure 5:
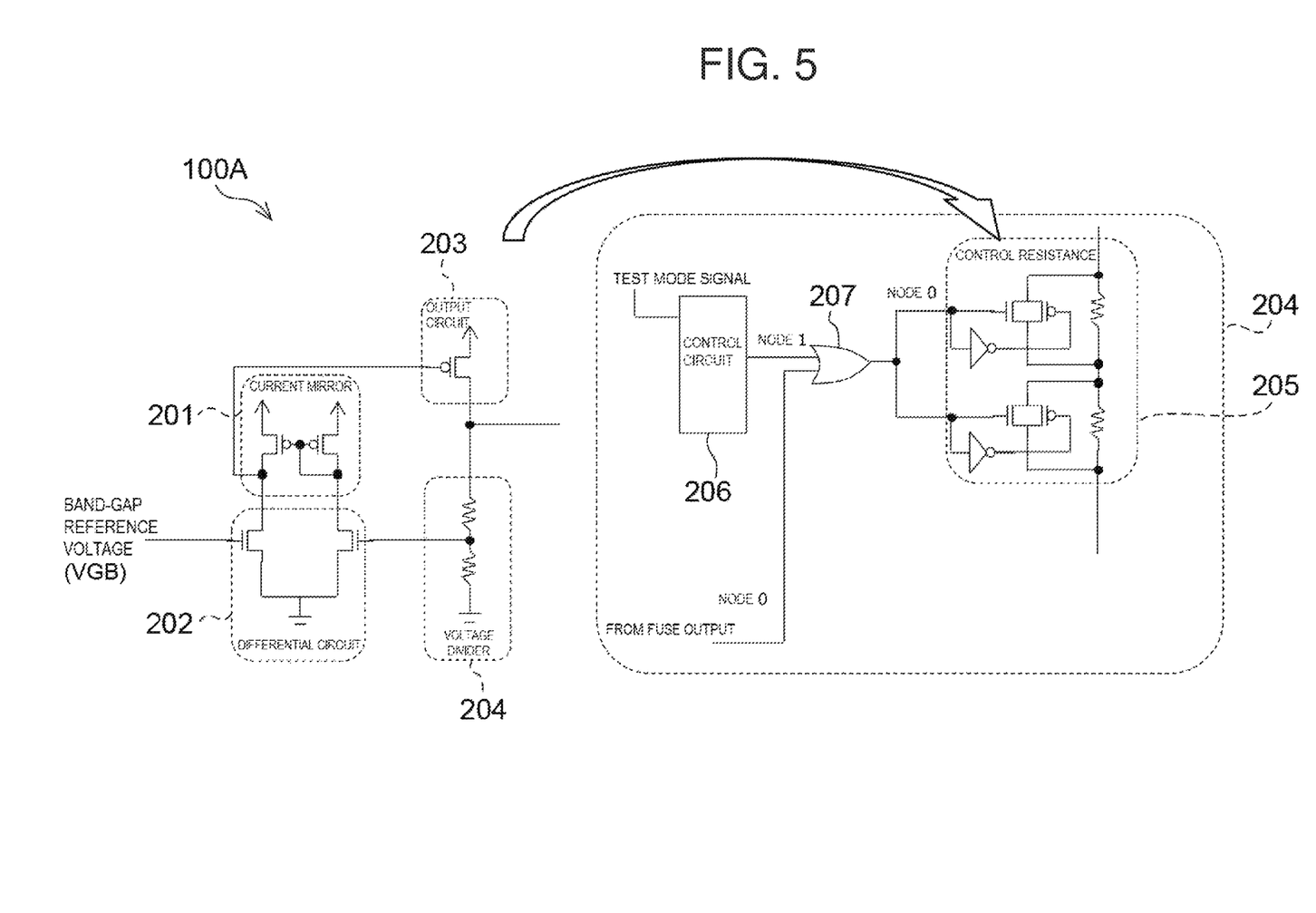
FIG. 5 is a circuit diagram illustrating the configuration of a semiconductor device of Comparison Example 2.

One example of the methods to minimize the number of evaluation semiconductor chips is to employ the soft trimming function of the fuse. FIG. 5 illustrates a regulator circuit 100A, which is an example of the regulator circuit including a divider circuit that employs soft trimming. In FIG. 5, a current mirror 201, a differential circuit 202, and an output circuit 203 are the same as the current mirror 101, the differential circuit 102, and the output circuit 103 of the regulator circuit 100. As shown in FIG. 5, the regulator circuit 100A is obtained by adding a control circuit 206 and an OR circuit 207 to the regulator circuit 100, and is configured to control the control resistance based on a signal generated by the control circuit 206 based on a given test mode signal of a high level (H) or a low level (L) inputted from outside, and a signal obtained by calculating the logical sum (OR) of the fuse output, which makes it possible for the regulator circuit 100A to output a value similar to that after repair.

However, in the regulator circuit 100A, the output voltage (Node 1) of the control circuit 206 is at the level of the regulator voltage (or in other words, the level lowered down by a voltage down converter), and thus, while the regulator circuit 100A is starting up after the power is turned on, the output voltage fluctuates, and because this fluctuating signal is inputted into the voltage divider 204, the regulator circuit 100A would not start up normally.

The present invention was made in view of the problems described above, and is aiming at achieving a more stable operation in a semiconductor device having a trimming function that can be performed based on an external signal, instead of using a special device.

A semiconductor device of the present invention includes a circuit-to-be-adjusted in which an output characteristic thereof can be adjusted by a fuse controlled based on a fuse signal; a control circuit using, as a power source, an internal power source that has a converted voltage obtained by converting a voltage of an external power source, the control circuit being configured to generate control signals based on an inputted test signal, the control signals being able to adjust the circuit-to-be-adjusted, in place of the fuse signal; and a selector circuit that selects the fuse signal before the internal power source reaches a stable state after the external power source is turned on, and selects the control signal after the internal power source has reached a stable state.

According to the present invention, it is possible to achieve a more stable operation in a semiconductor device having a trimming function that can be performed based on an external signal, instead of using a special device.

DETAILED DESCRIPTION OF THE EMBODIMENTS

Below, embodiments of the present invention will be explained in detail with reference to figures. In the embodiments below, a regulator circuit having the trimming function, or a voltage down converter in particular will be explained as an example of the semiconductor device of the present invention. That is, the semiconductor device described below is a semiconductor device that is equipped with an analog circuit having a voltage divider, which can be adjusted by a fuse, and that performs the trimming function (fine-tuning of the voltage divider) using a fuse for controlling variations in the analog circuits caused by the manufacturing process by inputting a certain test mode signal from outside, instead of performing a laser repair by a repairing apparatus. That is, the semiconductor device described below is a semiconductor device having the soft-trimming function where a value after trimming can be obtained without actually cutting off a fuse.

Embodiment 1

Figure 1:
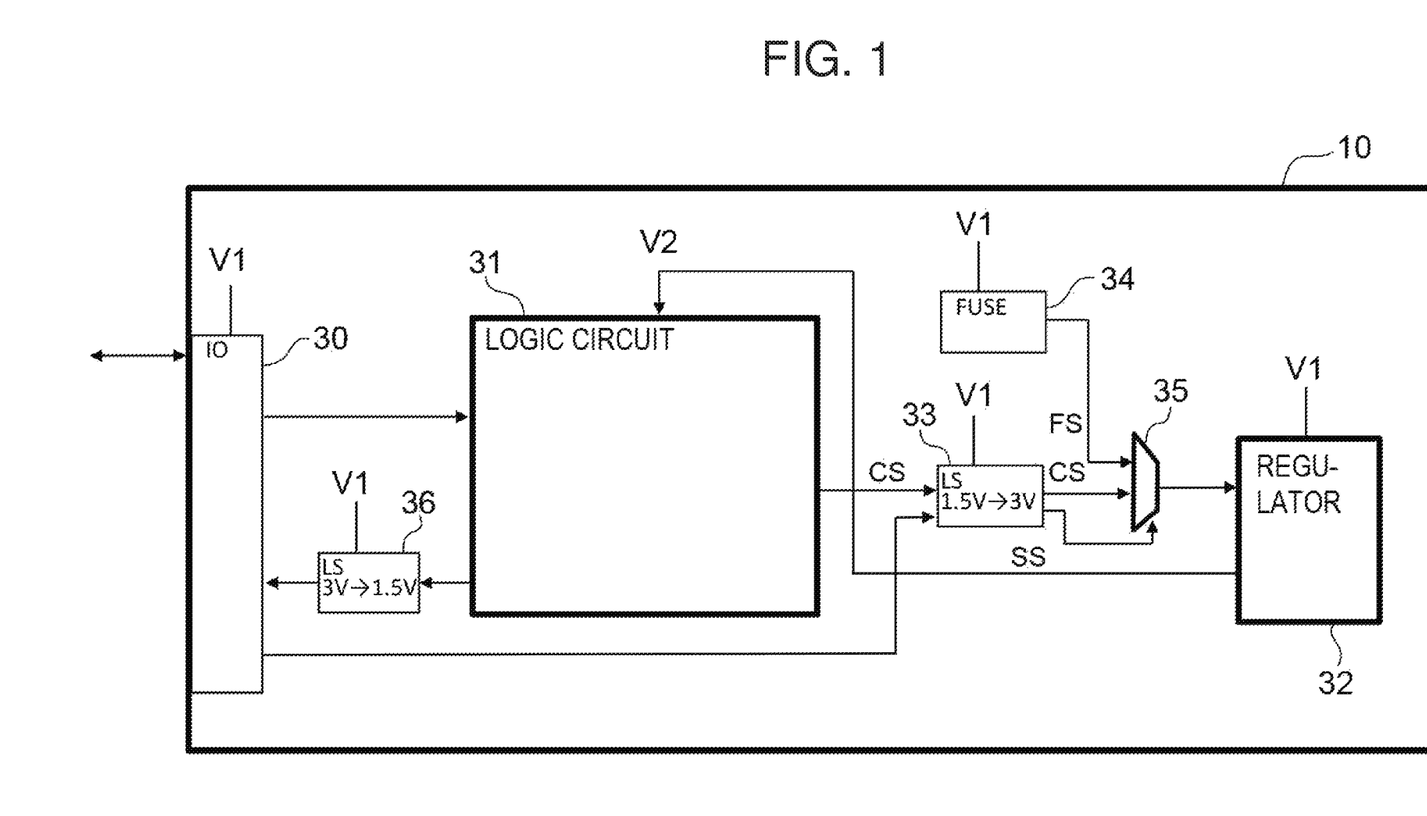
FIG. 1 is a block diagram illustrating an example of the configuration of a semiconductor device of Embodiment 1.

With reference to FIG. 1, the entire configuration of a semiconductor device 10 of Embodiment 1 will be explained. As shown in FIG. 1, the semiconductor device 10 includes I/O (input/output interface) 30, a logic circuit 31, a regulator 32, a level shifter 33 (in FIG. 1, LS 1.5V→3V), a fuse 34, a multiplexer 35, and a level shifter 36 (in FIG. 1, LS 3V→1.5V). The power source voltage supplied to each unit of the semiconductor device 10 has two types: an external voltage (voltage of the external power source before the level shift) V1; and an internal voltage (voltage of the internal power source after the level shift) V2. Also, the signal level between the respective circuit blocks inside of the semiconductor device 10 has two levels: a level corresponding to the external voltage V1 (will also be referred to as the "external level"), and a level corresponding to the internal voltage V2 (will also be referred to as the "internal voltage level"). In Embodiment 1, the external voltage is 3V, for example, and the internal voltage is 1.5V, for example.

The I/O 30 is an interface through which the semiconductor device 10 receives signals from outside the semiconductor device 10 and transmits signals to outside the semiconductor device 10. The level shifter 36 is a level conversion circuit that converts a signal from the external voltage level to the internal voltage level. The external voltage V1 is applied to the I/O 30 and the level shifter 36.

The regulator 32 is a circuit that lowers the voltage from the external voltage V1 to the internal voltage V2. The external voltage V1 is applied to the regulator 32.

The fuse 34 is a fuse to be cut off. The external voltage V1 is applied to the fuse 34. The fuse 34 outputs a fuse signal FS for adjusting the voltage divider.

The logic circuit 31 is a circuit that performs the main process of the semiconductor device 10. The internal voltage V2 is applied to the logic circuit 31. As shown in FIG. 1, the internal voltage V2 is supplied from the regulator 32. Below, parts that relate to the voltage down converter (specifically, the control circuit 306, 406 described later) will be explained as the logic circuit 31. The logic circuit 31 (or the control circuit 306, 406) outputs a control signal CS.

The multiplexer 35 is a selector circuit that selects one of the fuse signal FS and the control signal CS based on a selection signal SS, and sends the selected signal to the regulator 32. Although not shown in FIG. 1, the external voltage V1 is applied to the multiplexer 35.

The level shifter 33 is a level conversion circuit that converts a signal from the internal voltage level to the external level. The level shifter 33 converts the level of the control signal CS from the internal voltage level to the external level, and sends the converted signal to the multiplexer 35. The external voltage V1 is applied to the level shifter 33.

Figure 2:
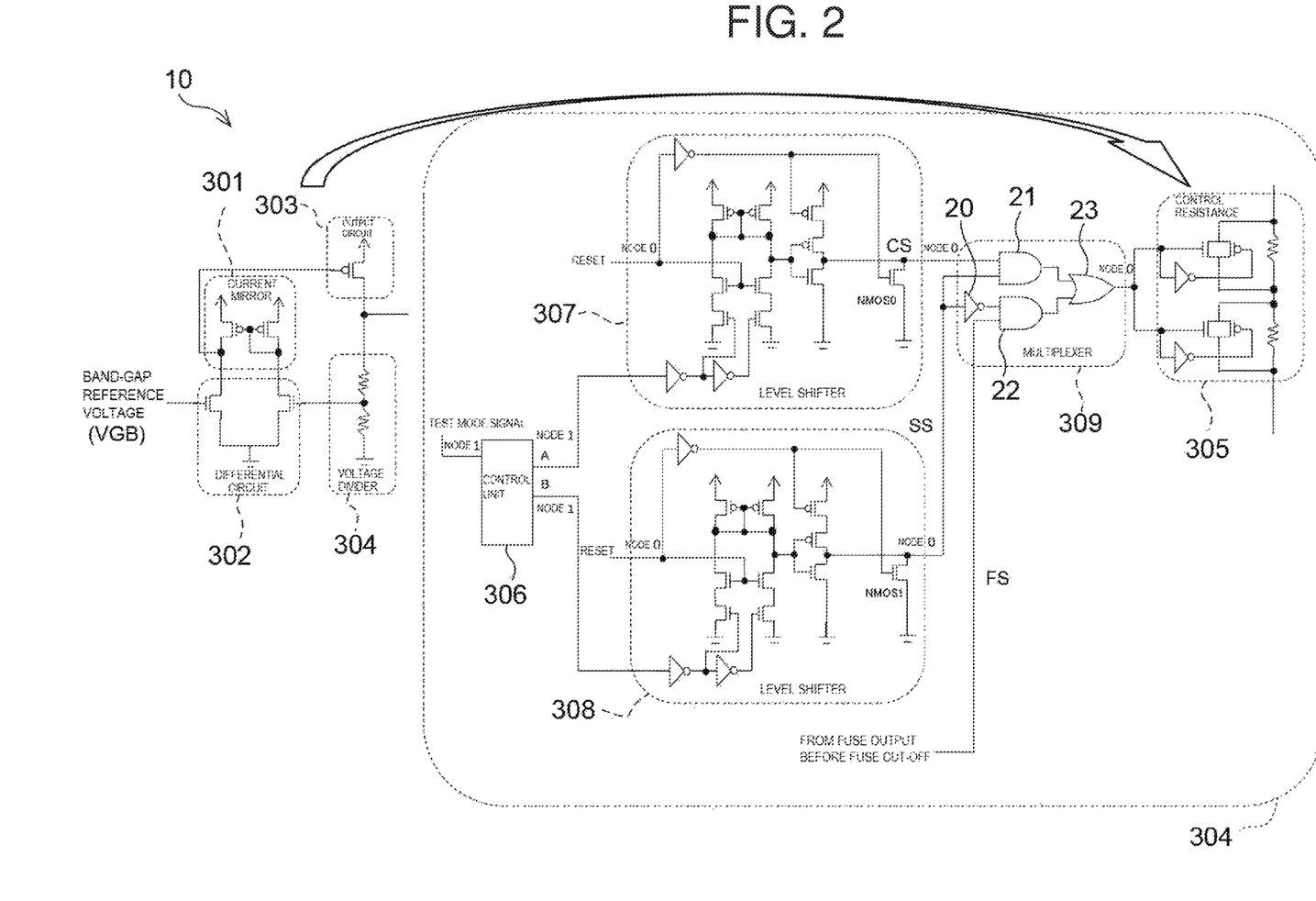
FIG. 2 is a circuit diagram illustrating an example of the configuration of a semiconductor device of Embodiment 1.

With reference to FIG. 2, the semiconductor device 10 (regulator circuit) of this embodiment will be explained in further detail. As shown in FIG. 2, the semiconductor device 10 includes a current mirror 301, a differential circuit 302, an output circuit 303, and a voltage divider 304. The current mirror 301, the differential circuit 302, and the output circuit 303 may be the same as the current mirror 101, the differential circuit 102, and the output circuit 103 shown in FIG. 4. In this embodiment, the output voltage of the output circuit 303 is set to 1.5V, for example.

A band-gap reference voltage (VGB) is inputted into one input of the differential circuit 302, and a voltage obtained by dividing the output voltage of the output circuit 303 by the voltage divider 304 (will be referred to as the divided voltage) is inputted into the other input of the differential circuit 302. The current mirror 301 outputs a current corresponding to a difference between the band-gap reference voltage and the divided voltage to a P-type MOS-FET (P-type metal oxide semiconductor-field effect transistor: will be referred to as PMOS below) of the output circuit 303.

As shown in FIG. 2, the voltage divider 304 includes a control circuit 306, a level shifters 307 and 308, a multiplexer 309, and a control resistance circuit 305. The semiconductor device 10, the level shifters 307 and 308, and the multiplexer 309 of FIG. 2 correspond to the regulator 32, the level shifter 33, and the multiplexer 35 of FIG. 1, respectively. The control circuit 306 is included in the logic circuit 31 of FIG. 1.

The control resistance circuit 305 is a resistance to adjust a divided voltage in the voltage divider 304, and includes a plurality of resistances connected in series, and a transfer gate connected to each of the resistances in parallel, for example. FIG. 2 illustrates the control resistance circuit 305 constituted of two resistances connected in series, but the control resistance circuit 305 may be constituted of three or more resistances. By switching the transfer gate between a conduction state and a non-conduction state, the resistance can be connected or disconnected.

The control circuit 306 is a circuit that generates, from the test mode signal, signals A and B for controlling the resistance value of the control resistance circuit 305. The signal A corresponds to the control signal CS in FIG. 1, and the signal B corresponds to the selection signal SS. The control circuit 306 is applied with the internal voltage V2, and the signals A and B are at the internal voltage level V2. In FIG. 2, the node denoted with "Node 1" is at the internal voltage level V2, and the node denoted with "Node 2" is at the external voltage level V1. The test mode signal and the signal A are respectively examples of the "test signal" and the "control signal" of the present invention.

The level shifter 307 converts the signal A of the internal voltage level to a signal of the external level, and sends the converted signal to the multiplexer 309. The level shifter 308 converts the signal B of the internal voltage level to a signal of the external level, and sends the converted signal to the multiplexer 309. The signals A and B are signals for controlling the resistance value of the control resistance circuit 305. In each of the level shifters 307 and 308, a reset signal is inputted from a reset terminal. The reset signal is an external voltage level signal inputted when the external power source is turned on, and as described below, the reset signal causes the multiplexer 309 to output the fuse signal FS when the semiconductor device 10 is powering up.

In one embodiment, the multiplexer 309 is constituted of an inverter 20, AND circuits 21 and 22, and an OR circuit 23, and the output from the level shifter 307 and the output from the level shifter 308 are connected to the input of the AND circuit 21. The output of the level shifter 308 and the fuse output via the inverter 20 are connected to the input of the AND circuit 22, and the output of the AND circuit 21 and the output of the AND circuit 22 are connected to the input of the OR circuit 23. The output of the OR circuit 23 (or in other words, the output of the multiplexer 309) is connected to the control resistance circuit 305. The multiplexer 309 has the same function as the multiplexer 35 of FIG. 1.

Next, the operation of the voltage divider 304 will be explained. Initially, the fuse 34 is not cut off. When the semiconductor device 10 is starting up (right after the power is turned on), the potential of the Node 0, which is at the external voltage level (a level determined by the external power source) is determined, but the potential of the Node 1, which is at the internal voltage level (a level determined by the internal voltage lowered down from the external voltage) has not been determined yet as the regulator circuit is still starting up. That is, although the reset signal, which is inputted into the level shifter 307, is at the external voltage level and the potential has already been determined, the level of the signal A from the control circuit 306 is not yet determined. In this case, when the reset signal is L, NMOS0 is on, and therefore, the output of the level shifter 307 is L regardless of the signal A from the control circuit 306. NMOS means N-type MOS-FET (metal oxide semiconductor-field effect transistor).

The same applies to the level shifter 308. Although the reset signal, which is inputted into the level shifter 308, is at the external voltage level and the potential has already been determined, the level of the signal A from the control circuit 306 is not yet determined. When the reset signal is L, NMOS1 is on, and thus, the output of the level shifter 308 is L regardless of the signal B from the control circuit 306.

When the outputs of the level shifters 307 and 308 are L, the value of the fuse signal FS before the cut-off (all L) is output as is from the multiplexer 309, which defines the resistance value of the control resistance circuit 305, and as a result, the semiconductor device 10 starts up normally. After the semiconductor device 10 has started up normally (after the internal voltage is stabilized), the Node 1 goes down to the internal voltage level. As a result, a signal for controlling the control resistance circuit 305 is generated in the control circuit 306 based on the test mode signal. In this embodiment, the fuse signal FS is active H. That is, the fuse signal FS that indicates the fuse needs to be cut off is H, and the fuse signal FS that indicates the fuse does not need to be cut off is L. In an alternative embodiment, this logical relationship may be reversed.

While the internal power source of the semiconductor device 10 is starting up (before reaching a stable state), the control resistance circuit 305 receives the fuse signal FS, and as a result, the division resistance value of the voltage divider 304 is determined, and then the output voltage of the semiconductor device 10 is determined. On the other hand, after the internal power source of the semiconductor device 10 has started up (reached a stable state), the reset signal is released, and thus, the signals A and B for controlling the resistance value can be generated from the test mode signal, which is supplied from outside the semiconductor device 10, in the control circuit 306. That is, by inputting a certain test mode signal of H or L from outside the semiconductor device 10 to the control resistance circuit 305 via the control circuit 306, a regulator value (voltage) similar to that would have been obtained by performing the trimming using a repairing apparatus can be obtained. Whether the internal power source has started up or not can be determined based on the degree of stability of the potential of the internal power source, or a time that has passed after the external power source is turned on, for example.

The start-up order of power sources and signals described above can be summarized as follows:

(1) the external power source is turned on, and the reset signal is inputted;
(2) the multiplexer outputs the fuse signal FS;
(3) the regulator voltage is set by the fuse signal FS;
(4) the internal power is turned on, and the reset signal is canceled;
(5) the signals A and B are generated by the test mode signal;
(6) the multiplexer outputs the control signal CS; and
(7) the regulator voltage is set by the control signal CS.

As described above in detail, according to the semiconductor device 10 (regulator circuit) of this embodiment, not only is the normal start-up of the semiconductor device 10 ensured, but also it is possible to select an appropriate resistance value (or adjust, to the appropriate level, the resistance value) of the control resistance circuit 305 of the voltage divider 304 by inputting a test mode signal from outside the semiconductor device 10 without cutting off a fuse by laser repair using a repairing apparatus, which makes it possible to obtain the same regulator value as that would have been obtained by actually performing the trimming. As a result, the trimming evaluation can be performed on the regulator circuit even if a repairing apparatus is not available.

Embodiment 2

Figure 3:
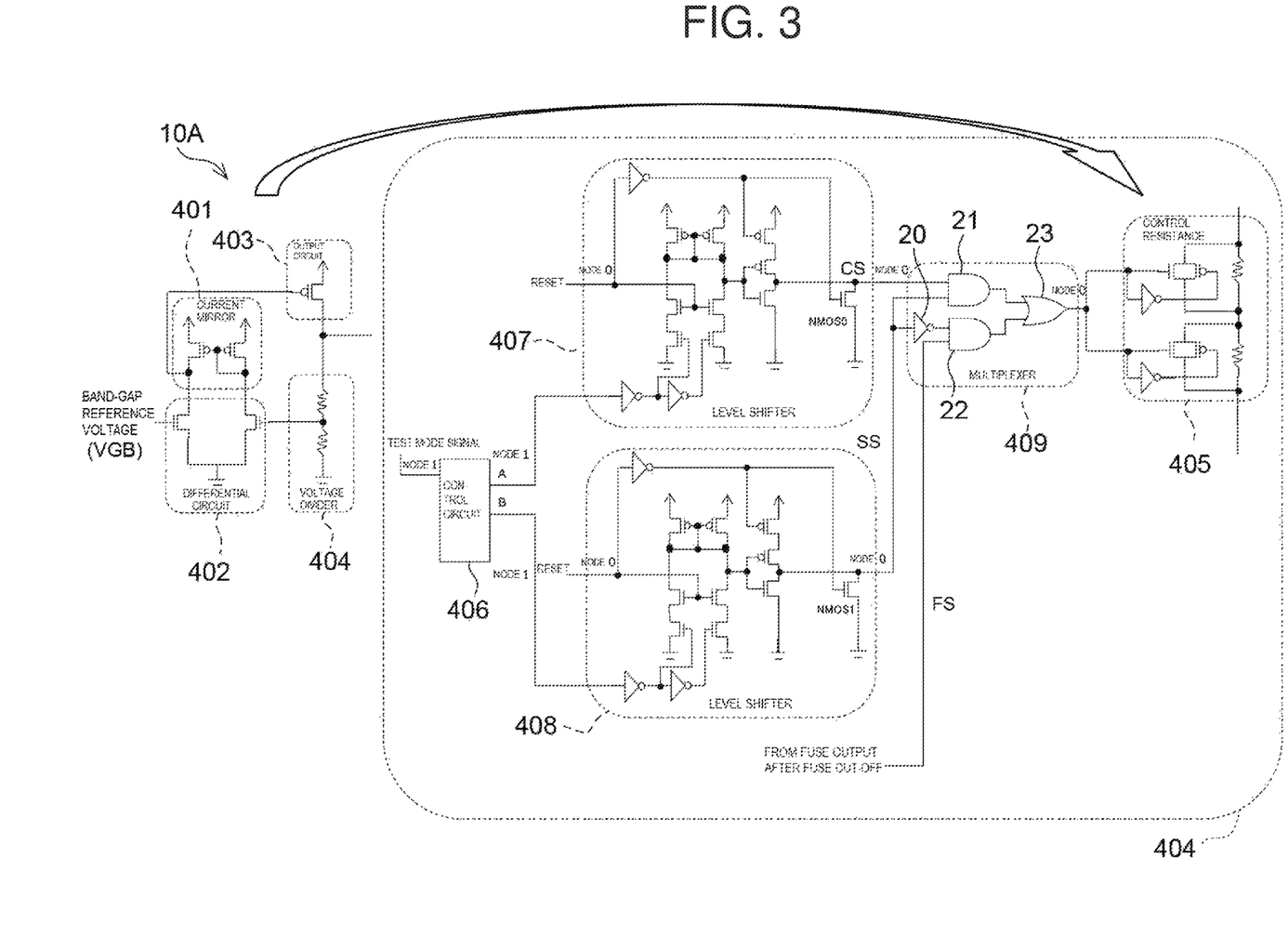
FIG. 3 is a circuit diagram illustrating an example of the configuration of a semiconductor device of Embodiment 2.

With reference to FIG. 3, a semiconductor device 10A (regulator circuit) of Embodiment 2 will be explained. The semiconductor device 10A is constituted of a circuit similar to the semiconductor device 10 of Embodiment 1. That is, as shown in FIG. 3, the semiconductor device 10A includes a current mirror 401, a differential circuit 402, an output circuit 403, and a voltage divider 404. As shown in FIG. 3, the voltage divider 404 includes a control circuit 406, level shifters 407 and 408, a multiplexer 409, and a control resistance 405. The semiconductor device 10A has the same circuit configuration as the semiconductor device 10, and the configurations of the same names have the same functions.

The operation of the semiconductor device 10A will be explained below. Unlike Embodiment 1, the fuse is already cut off.

During the start-up period of the external power source of the semiconductor device 10A, the potential of the Node 0 is determined because the Node 0 is at the external level, but the potential of the Node 1 is not yet determined as the regulator circuit has not yet been turned on. That is, although the reset signal, which is inputted into the level shifter 407, is at the external voltage level and the potential has already neem determined, the level of the signal A from the control circuit 406 is not yet determined. When the reset signal is L, NMOS0 is on, and therefore, the output of the level shifter 407 is L regardless of the signal A from the control circuit 406.

The same applies to the level shifter 408. Although the reset signal, which is inputted into the level shifter 408, is at the external voltage level and the potential has already been determined, the level of the signal B from the control circuit 406 is not yet determined. When the reset signal is L, NMOS1 is on, and therefore, the output of the level shifter 408 is L regardless of the signal B from the control circuit 406.

When the outputs of the level shifters 407 and 408 are L, the value of the fuse that is already cut off is output from the multiplexer 409, which determines the divided voltage of the voltage divider 404, and as a result, the semiconductor device 10A starts up normally. On the other hand, after the semiconductor device 10A has normally started up, the potential of the Node 1 is fixed to the internal voltage level, and as a result, a signal for controlling the control resistance 405 in the control circuit 406 is generated based on the test mode signal.

That is, before the internal power source of the semiconductor device 10A is turned on, the division resistance value of the voltage divider 404 is determined by the control resistance 405 that has received the fuse signal FS, and then the output voltage of the regulator circuit is determined. On the other hand, after the internal power source of the semiconductor device 10A is turned on, the signals A and B for controlling the division resistance value of the voltage divider 404 can be generated from the test mode signal, which is supplied from outside, in the control circuit 406. That is, by inputting the test mode signal into the control resistance 405 from outside, it is possible to obtain a regulator value that was adjusted in a manner similar to a repairing apparatus.

As described above in detail, according to the semiconductor device 10A (regulator circuit) of this embodiment, not only is the normal start-up of the semiconductor device 10A ensured even after the fuse is cut off, but also it is possible to select an appropriate resistance value (or adjust, to the appropriate level, the resistance value) of the control resistance 405 of the voltage divider 404 by inputting a test mode signal from outside without cutting off a fuse by performing laser repair using a repairing apparatus, which makes it possible to obtain the same regulator value as that would have been obtained by actually performing the trimming. As a result, the trimming evaluation can be performed on the regulator circuit even if a repairing apparatus is not available.

In the embodiments described above, an example in which the semiconductor device of the present invention was used for fine-tuning the regulator circuit was described, but the present invention is not limited to a regulator circuit. Instead, embodiments of the invention may be applied to any other devices that have a trimming function using a fuse.

In the embodiments described above, the multiplexer including one inverter, two AND circuits, and one OR circuit was described as an example, but the multiplexer may also have NAND circuits, NOR circuits, and the like as long as the input/output logic is the same.

In the embodiments described above, a resistance was described as an example of the target for trimming, but the present invention is not limited to this, and a capacitance, a diode, or the like may also be subjected to trimming.

DESCRIPTIONS OF REFERENCE CHARACTERS 10, 10A Semiconductor Device
20 Inverter
21, 22 AND Circuit
23 OR Circuit
30 IO
31 Logic Circuit
32 Regulator
33 Level Shifter
34 Fuse
35 Multiplexer
36 Level Shifter
100, 100A Regulator Circuit
101, 201, 301, 401 Current Mirror
102, 202, 302, 402 Differential Circuit
103, 203, 303, 403 Output Circuit
104, 204, 304, 404 Voltage Divider
105, 205, 305, 405 Control Resistance 206, 306, 406
206 Control Circuit
207 OR Circuit
307, 308, 407, 408 Level Shifter
309, 409 Multiplexer
FS Fuse Signal
SC Control Signal
SS Selection Signal
V1 External Voltage
V2 Internal Voltage

What is claimed is:
1. A semiconductor device, comprising:
a circuit-to-be-adjusted having an output characteristic that is adjustable by a fuse that is controlled based on a fuse signal;
a control circuit using, as a power source, an internal power source that has a converted voltage obtained by converting a voltage from an external power source, the control circuit being configured to generate a control signal based on an inputted test signal, wherein the output characteristic of the circuit-to-be-adjusted is adjustable by each of the fuse signal and the control signal; and
a selector circuit that receives as an input each of the fuse signal and the control signal, and selectively outputs to the circuit-to-be-adjusted one of the fuse signal and the control signal, the selector circuit configured to select the fuse signal before the internal power source reaches a stable state after the external power source is turned on, and configured to select the control signal after the internal power source has reached the stable state.

2. The semiconductor device according to claim 1, wherein the selector circuit receives a reset signal that causes the fuse signal to be selected as an output of the selector circuit when the external power source is turned on.

3. The semiconductor device according to claim 1, wherein the selector circuit selects one of the fuse signal and the control signal based on a selection signal, and
   wherein, once the selector circuit has selected the one of the fuse signal and the control signal, the control circuit is configured to again generate the selection signal.

4. The semiconductor device according to claim 3, wherein the control circuit operates at the converted voltage,
   wherein the selector circuit operates at a voltage of the external power source, and
   wherein the semiconductor device further comprises a level shift circuit disposed between the control circuit and the selector circuit, the level shift circuit configured to change a level of the control signal and the selection signal from a level corresponding to the internal power source to a level corresponding to the external power source.

5. The semiconductor device according to claim 1, wherein the semiconductor device is a voltage conversion circuit that generates the converted voltage from the external power source,
   wherein the output characteristic is an output voltage of the voltage conversion circuit, and
   wherein the circuit-to-be-adjusted is a division resistance that defines the output voltage.

6. The semiconductor device according to claim 1, wherein the control circuit generates the control signal before and after the fuse is cut off.

\* \* \* \* \*